United States Patent
Yokoo

(10) Patent No.: US 7,277,006 B2
(45) Date of Patent: Oct. 2, 2007

(54) CHIP RESISTOR

(75) Inventor: Hideo Yokoo, Fukaya (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/543,077

(22) Filed: Oct. 5, 2006

(65) Prior Publication Data

US 2007/0120266 A1    May 31, 2007

(30) Foreign Application Priority Data

Nov. 30, 2005    (JP)    ............................ 2005-346088

(51) Int. Cl.
*H01C 1/012*    (2006.01)
(52) U.S. Cl. ...................... 338/309; 338/307; 338/328
(58) Field of Classification Search ........ 338/307–309, 338/48, 115, 254, 260, 328
See application file for complete search history.

(56) References Cited

U.S. PATENT DOCUMENTS 5,929,746 A * 7/1999 Edwards et al. ............ 338/320
5,945,905 A * 8/1999 Mazzochette ................ 338/51
5,977,863 A * 11/1999 Bloom et al. ............... 338/320

FOREIGN PATENT DOCUMENTS

JP    06-275411    9/1994
JP    2000-030915    1/2000
JP    2002-343614    11/2002

* cited by examiner

*Primary Examiner*—Kyung Lee
(74) *Attorney, Agent, or Firm*—Pillsbury Winthrop Shaw Pittman, LLP

(57) ABSTRACT

Chip resistor includes the rectangular first substrate made of ceramics and having surfaces, the rectangular second substrate made of ceramics and having surfaces, and a joint layer interposed between the surfaces, and electrodes are formed on two opposing sides of the substrate and resistor is formed between the electrodes. Further, electrodes are formed on two opposing sides of the substrate and resistor is formed between the electrodes.

16 Claims, 3 Drawing Sheets

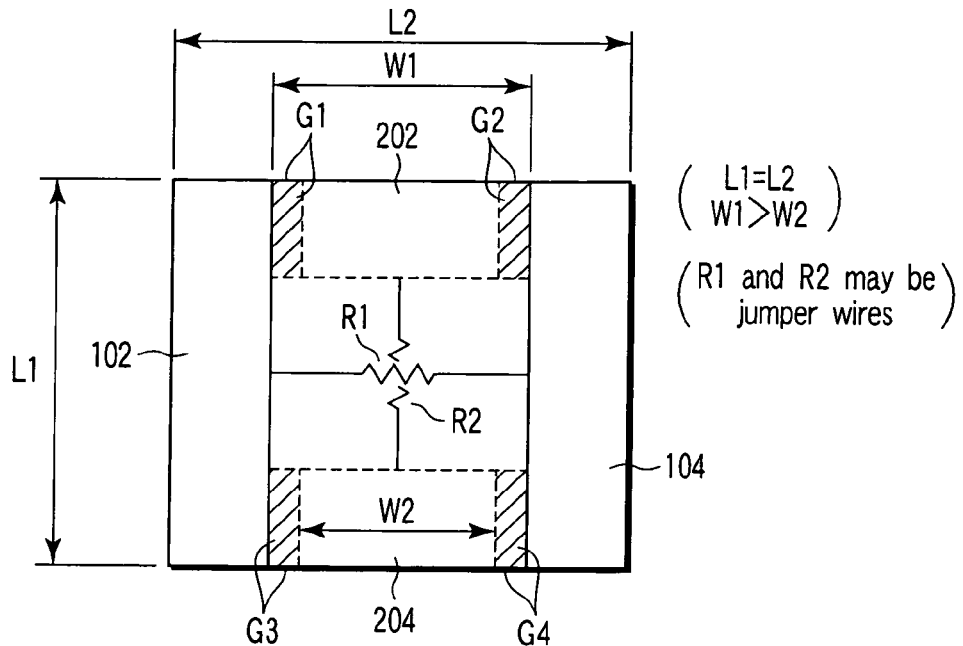
FIG. 2
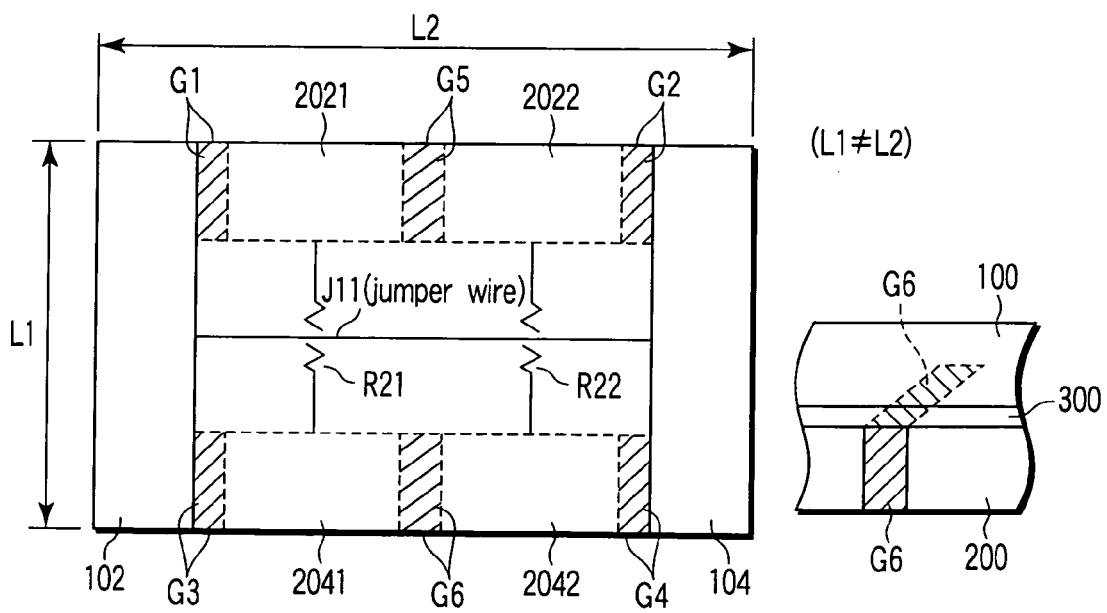 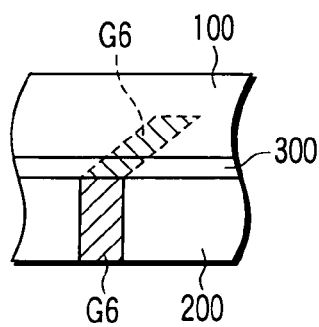
FIG. 3A  FIG. 3B

CHIP RESISTOR

CROSS-REFERENCE TO RELATED APPLICATIONS

This application is based upon and claims the benefit of priority from Japanese Patent Application No. 2005-346088, filed Nov. 30, 2005, the entire contents of which are incorporated herein by reference.

BACKGROUND

1. Field

The present invention relates to a chip resistor to be directly mounted on a wiring pattern of a printed wiring board by, for example, soldering. More specifically, the invention relates to a chip resistor of a multi-layered structure in which a plurality of resist elements and jumper wiring, etc. can be built in to be electrically independently from each other.

2. Description of the Related Art

Recent years, electronic devices are being further advanced in terms of downsizing, density and functions as can be seen in the field of mobile telephones, handy movie cameras, etc. In accordance with these advances, the wiring patterns of the printed wiring boards in which circuits with desired functions are becoming more dense and complicated. Therefore, there is a great demand for a multi-layered printed wiring board in which wiring lines can cross each other without coming into electrical contact with each other. However, multi-layered printed wiring boards with a number of layers are costly. Under the circumstances, there is further a demand for a single layer printed wiring board (or if not possible, a multi-layered printed wiring board with a least as possible number of layers) in which desired parts can be completely mounted.

In order to mount circuit parts on a single layer printed wiring board (or a surface print pattern of a multi-layered print pattern) at a high density, the pattern of such a printed wiring board is designed such that wiring lines pass between electrode leads of the circuit parts (such as resistors, capacitors, transistors and ICs) in many cases. In the case where the circuit pattern part does not allow such a design that lines are passed between electrode leads for some reason, jumper wires are employed. However, a jumper wire takes up an excessive area of the printed wiring board (, as compared to the case where a jumper wire is provided inside the laminated circuit board of a multi-layered printed wiring board), and therefore it is difficult to reduce the size or increase the density of the printed wiring board.

There has been provided a multi-electrode type resistor to be mounted on a surface of a circuit board, which enables crossing of circuits on a single-layer printed wiring board as in the above-described case where jumper wires are employed. (See Jpn. Pat. Appln. KOKAI Publication No. 2002-343614.) Further, as similar surface mount-type resistor, there are a double chip resistor (Jpn. Pat. Appln. KOKAI Publication No. 06-275411) and a double resistor chip (Jpn. Pat. Appln. KOKAI Publication No. 2000-030915).

The multi-electrode resistor disclosed in Jpn. Pat. Appln. KOKAI Publication No. 2002-343614 has such a structure in which four resistors one end of each of which are electrically connected to each other are formed on a chip substrate and both ends of two pairs of resistor circuits (1a-1c and 1b-1d) are arranged to cross each other. (See FIG. 1 of this document.) When it is assumed that the above-described jumper wires are substituted with resistors, it is possible to make circuits cross each other on a single layer printed wiring board. This document further discloses a structure in which one of the two pairs of resistor circuits are replaced with jumper wires. (See FIG. 5 of this document.) In this case, it appears from the figure that circuits can cross each other on the single layer printed wiring board that uses the jumper wires.

In the double chip resistor disclosed in Jpn. Pat. Appln. KOKAI Publication No. 06-275411, two pairs of resistor circuits are arranged to cross each other on both surfaces of the chip board. (See FIGS. 1 and 2 of this document.) With this structure, the circuits can cross each other on the single layer printed wiring board that uses jumper wires.

One of the objects of the invention is to provide a chip resistor that can realize an electrically separated circuit crossing structure on a printed wiring board on which the circuits are mounted.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 2 is a diagram illustrating an example of structure (Example 1) in the case where the wiring board of the chip resistor is of a square shape;

FIGS. 3A and 3B are diagrams illustrating an example of structure (Example 2) in the case where the wiring board of the chip resistor is of a rectangular shape.

DETAILED DESCRIPTION

Various embodiments according to the invention will be described hereinafter with reference to the accompanying drawings. In general, according to one embodiment of the invention, a chip resistor includes a first substrate having a polygonal flat-panel shape, made of an electrical insulating material and having a first upper surface and a first lower surface, a second substrate having a polygonal flat-panel shape, made of an electrical insulating material and having a second upper surface and a second lower surface, and a joint layer interposed between the first lower surface of the first substrate and the second upper surface of the second substrate and made of an electric insulating material, the chip resistor comprises first and second electrodes formed on two first opposing sides of the polygonal flat-panel shape of the first substrate, a first electric circuit formed on the first upper surface and/or the first lower surface between the first electrode and the second electrode, and having a predetermined conductivity property or a predetermined electric resistance, third and fourth electrodes formed on two second opposing sides of the polygonal flat-panel shape of the second substrate, a second electric circuit formed on the second upper surface between the third electrode and the fourth electrode, and having a predetermined conductivity property or a predetermined electric resistance and a gap that shut off electric conductivity, formed between the first and second electrodes and between the second and fourth electrodes, wherein a first direction that connects the two first opposing sides and a second direction that connects the two second opposing sides cross each other while the first substrate and the second substrate stack one on another via the joint layer as viewed from the first upper surface, the first electric circuit and the second electric layer are electrically separated from each other via the joint layer, and the second electric circuit and the second lower surface of the second substrate are set away from each other by a thickness of the second substrate.

Figure 1:
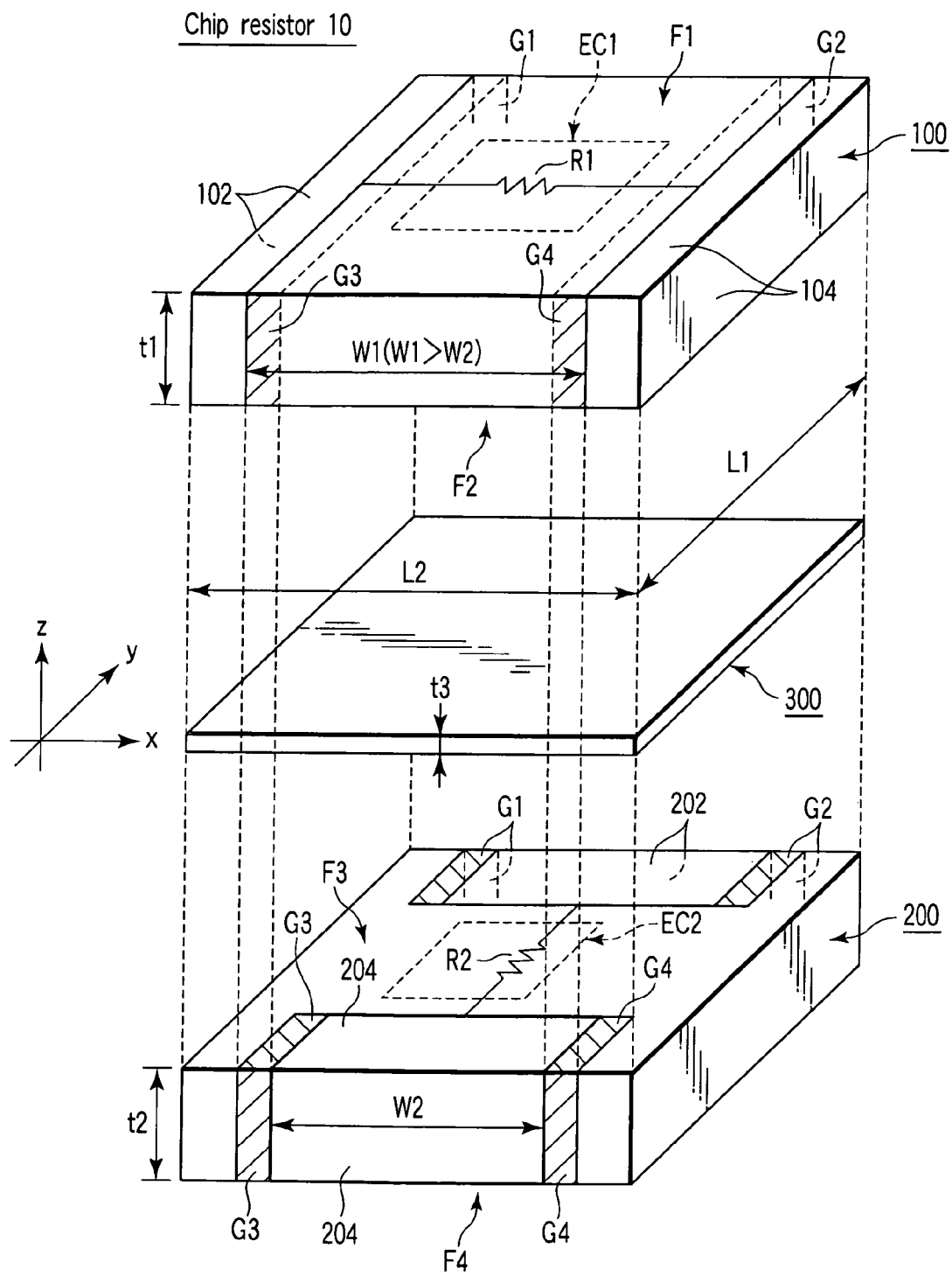
FIG. 1 is a perspective view showing the structure of a chip resistor according to an embodiment.

An embodiment of the invention will now be described with reference to accompanying drawings. FIG. 1 is a perspective view showing the structure of a chip resistor according to an embodiment of the invention. As shown in this figure, a ceramic substrate 100 has a length L1 (for example, about 0.5 to 1.5 mm) in a y direction, a length L2 (for example, about 1.0 to 2.5 mm) in an x direction and a thickness t1 (for example, about 0.2 to 0.3 mm) in a z direction, and a thin film resistor R1 mainly made of ruthenium oxide (, or a jumper wire pattern having an extremely low resistance, obtained by baking silver paste or the like) is formed as a first electric circuit EC1 on an upper surface F1 of the ceramic substrate 100. Two x-directional opposing sides of the substrate 100 are coated with silver/palladium-based paste (or silver paste) such that their end portions are covered in a U shape, and then heated and baked, thereby forming electrodes 102 and 104. Although not shown in the figure, a thin film resistor (or jumper lines) can be formed on a lower surface F2 of the substrate 100.

Further, a ceramic substrate 100 has a length L1 and a length L2 which are the same as those of the substrate 100 and a thickness t2 (for example, about 0.2 to 0.3 mm: it may be the same as or different from t1) in a z direction, and a thin film resistor R2 mainly made of ruthenium oxide (, or a jumper wire pattern having an extremely low resistance, obtained by baking silver paste or the like) is formed as a second electric circuit EC2 on an upper surface F3 of the ceramic substrate 200. Two y-directional opposing sides of the substrate 200 are coated with silver/palladium-based paste (or silver paste) such that their end portions are covered in a U shape, and then heated and baked, thereby forming electrodes 202 and 204. Here, a paste coating width (that is, electrode width) W2 of each of the electrodes 202 and 203 is set narrower than an interval W1 between the electrodes 102 and 104 of the substrate 100. (For example, when L2 is 1.5 mm, and W1 is 1.2 mm, W2 is set to 0.6 mm.) With this structure, when the substrate 100 is jointed to the substrate 200 via an insulating joint layer 300 made of lead glass (or an epoxy resin), gaps G1 to G4 are created to expose the surface of the ceramic substrate between the electrodes 102 and 104 and between the electrodes 2020 and 204. With these gaps, the electrical separation between the first electric circuit EC 1 and the second electric circuit EC2 is assured solely with a chip resistor. Not only that, but also in the case where the chip resistor is soldered (or brazed) to a pattern surface of the printed wiring board, which is not shown in the figure, by surface mounting, the occurrence of soldering bridges between the electrodes 102 and 104 and the electrodes 202 and 204 can be prevented. (Note that the ceramic surface repels solder and therefore the section where the ceramic surface is exposed serves as a gap that prevents a solder bridge.)

In the embodiment shown in FIG. 1, there is nothing formed on a lower surface F4 (, which is to be in contact with the pattern surface (not shown) of the printed wiring board) of the substrate 200; however it is possible to form an electric circuit such as a thin film resistor or jumper wire. In such a case, an insulating layer (not shown) made of, for example, glass or an epoxy resin can be further formed so as to cover the surface F4.

FIG. 2 is a diagram illustrating an example (Example 1) of the structure of the chip resistor according to the embodiment of the invention in the case where the substrate of the chip resistor has a square shape. This example presents the case where the substrate is a square (that is, L1=L2). In the case where the substrate has a square shape and the first electric circuit EC1 and the second electric circuit EC2 are the same as each other (for example, R1=R2 or they are both jumper wires, there would be no substantial damage caused even if the chip resistor is mounted and soldered to the printed wiring board in such a manner that the chip resistor is mounted at a position displaced by 90 degrees with respect to where it is supposed to be mounted in the board. Therefore, it is expected to lower the error occurrence rate in the manufacture of the printed wiring board on which a chip resistor is mechanically mounted. (Note that in the case where R1=R2 but the substrate of the chip resistor has a rectangular shape, if the mounting direction is displaced by 90 degrees, a mismatch is created between the electrode position of the chip resistor and the soldering position of the printed circuit board, which may create a problem.)

FIG. 3A and FIG. 3B are diagrams illustrating an example of structure (Example 2) in the case where the substrate of the chip resistor according to the embodiment is of a rectangular shape. This is a simple example of a multiple chip resistor in which a plurality of thin film transistors are formed continuously in the longitudinal direction of the chip. This example has a structure such as shown in FIG. 3A, in which two thin film resistors R21 and R22, which are electrically separated from each other via gaps G5 and G6 are provided on the wiring board 200, and a jumper wire J11 that which is electrically insulated from the multiple resistors R21 and R22 is provided on the wiring board 100 such as to cross these resistors. The gap G5 and G6 are extended to reach not only the side surface of the substrate but also a part of the flat surface of the wiring board as in the case of the gaps G1 to G4 shown in FIGS. 1 and 2. (See FIG. 3B.) With these gaps (G1 to G6), each adjacent pair of resistor electrodes are surely isolated electrically from each other, and so are each adjacent pair of electrodes. It should be noted that when a multiple chip resistor is formed to have a structure such as shown in FIG. 3A and FIG. 3B, the size (L2) increases in accordance with the number of resistors mounted.

Figure 4:
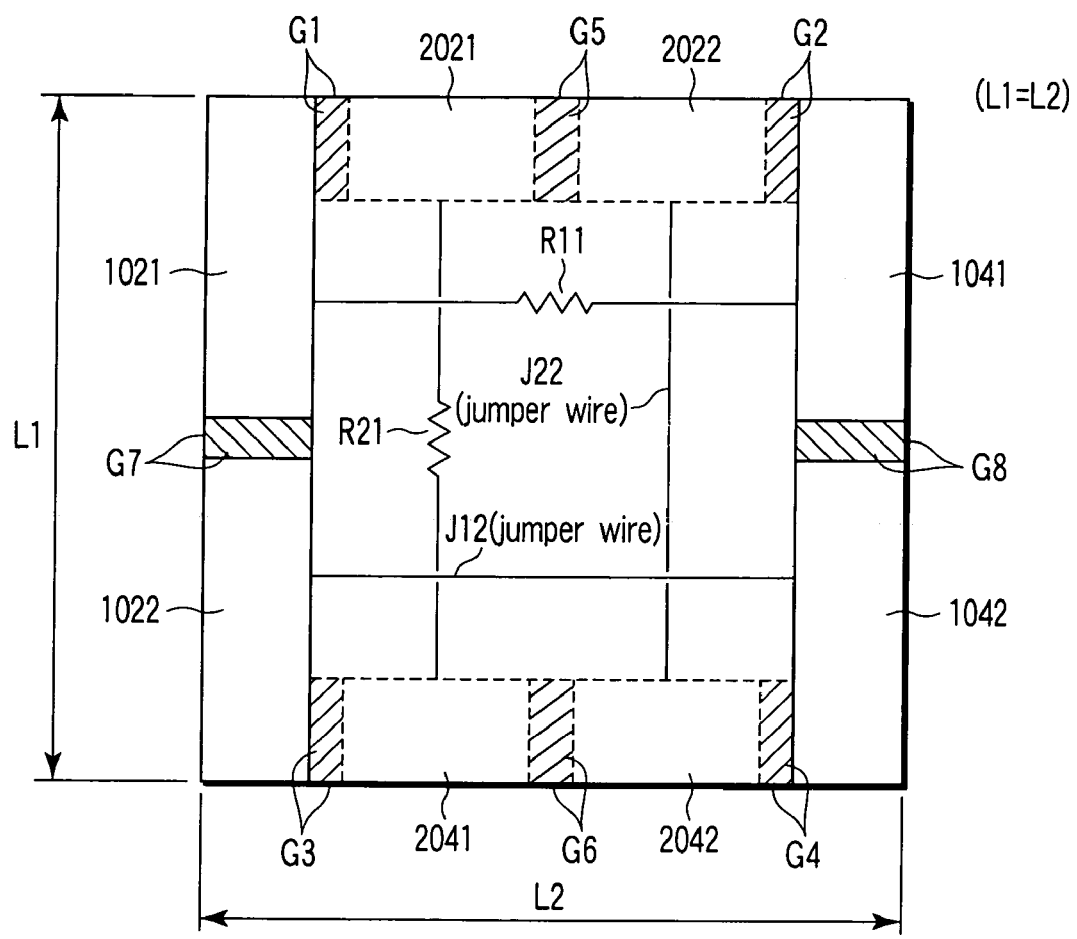
FIG. 4 is a diagram illustrating another example of structure (Example 3) in the case where the wiring board of the chip resistor is of a square shape.

FIG. 4 is a diagram illustrating another example of structure (Example 3) in the case where the substrate of the chip resistor according to the embodiment is of a square shape. This example presents a case where the chip substrate has a square shape (L1=L2), in which the electrical circuits (such as resistor R11 and jumper wire J12) of the wiring board 100 and the electrical circuits (such as resistor R21 and jumper wire J22) of the wiring board 200 are arranged to be rotationally symmetrical with respect to the center of the chip substrate (R11=R21, J12=J22). With this arrangement, even if the chip resistors are mounted and soldered to the printed wiring board such that the chip resistors are mounted at respective positions that are displaced by 90 degrees with respect to those where the resistors are supposed to be mounted in the wiring board, no substantial problem would occur. In the structure shown in FIG. 4, the gaps G5 and G6 serve to electrically separate the resistor 21 and the jumper wire J22 from each other, whereas the gaps G7 and G8 serve to electrically separate the resistor 11 and the jumper wire J12 from each other. It should be noted that when the jumper wires J12 and J22 are resistors in the structure shown in FIG. 4, a multiple chip resistor in which circuits cross each other can be obtained.

<Advantages Obtained by the Embodiment of the Invention>

(1) The mounting accuracy in the case where chip resistors are mounted on a pattern surface of a printed wiring board at a high density can be maintained. (Two chip resistors can be placed at the same location on a board, and therefore it is not necessary to reduce the size of each chip resistor in order to increase the density. When the size of each chip resistor is reduced, a higher mounting accuracy is accordingly required.)

(2) Crossing of circuits can be easily formed (pattern crossing), and the resistors can be used as jumpers. Thus, the resistors can be arranged to cross each other.

(3) The substrate occupying ratio in the case where a multiple resistor is used, can be reduced. (Theoretically, it can be reduced a half.)

(4) One of the circuits crossing each other, (that is, R2) is separated from the contact surface of the printed wiring board by the thickness of the second wiring board (200), and therefore it is possible to set a withstand voltage between that one (R2) of the crossing circuits and the wiring of the printed wiring board (not shown) directly underneath the circuit, to a sufficiently high level. Alternatively, it is possible to set a coupling capacity between that one (R2) of the crossing circuits and the wiring of the printed wiring board (not shown) directly underneath the circuit, to a low level. (For example, in the case of a high frequency circuit board of a GHz band, the coupling capacity may raise a problem.)

(5) Even if an electric circuit pattern is not provided on the surface (F4) brought into contact with the printed wiring circuit, crossing of circuits can be realized (via the chip resistor). Therefore, the surface (F4) is supposed to be in contact with the printed wiring board when mounted can be brought into tight contact with the surface of the printed wiring board. With this structure, the heat generated from the chip resistor can be released efficiently to the printed wiring board.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions. For example, in the embodiment shown in FIG. 1, resistors and jumper wire are used as circuit elements provided between electrodes; however capacitors, diodes and the like may be used as the circuit elements between electrodes.

The invention claimed is:

1. A chip resistor including a first substrate having a polygonal flat-panel shape, made of an electrical insulating material and having a first upper surface and a first lower surface, a second substrate having a polygonal flat-panel shape, made of an electrical insulating material and having a second upper surface and a second lower surface, and a joint layer interposed between the first lower surface of the first substrate and the second upper surface of the second substrate and made of an electric insulating material, the chip resistor comprising:

first and second electrodes formed on two first opposing sides of the polygonal flat-panel shape of the first substrate;

a first electric circuit formed on the first upper surface and/or the first lower surface between the first electrode and the second electrode, and having a predetermined conductivity property or a predetermined electric resistance;

third and fourth electrodes formed on two second opposing sides of the polygonal flat-panel shape of the second substrate;

a second electric circuit formed on the second upper surface between the third electrode and the fourth electrode, and having a predetermined conductivity property or a predetermined electric resistance; and a gap that shut off electric conductivity, formed between the first and second electrodes and between the second and fourth electrodes, wherein a first direction that connects the two first opposing sides and a second direction that connects the two second opposing sides cross each other while the first substrate and the second substrate stack one on another via the joint layer as viewed from the first upper surface, the first electric circuit and the second electric layer are electrically separated from each other via the joint layer, and the second electric circuit and the second lower surface of the second substrate are set away from each other by a thickness of the second substrate.

2. The chip resistor according to claim 1, wherein the polygonal flat-plate shape of each of the first substrate and the second substrate is a square, and the first electric circuit and the second electric circuit have the same electric properties.

3. The chip resistor according to claim 2, wherein the first substrate and/or the second substrate is formed of ceramics.

4. The chip resistor according to claim 3, wherein the joint layer is formed of glass or resin.

5. The chip resistor according to claim 4, wherein the first to fourth electrodes are made of an easily solderable metal.

6. The chip resistor according to claim 1, wherein the polygonal flat-plate shape of each of the first substrate and the second substrate is a rectangular.

7. The chip resistor according to claim 6, wherein the first substrate and/or the second substrate is formed of ceramics.

8. The chip resistor according to claim 7, wherein the joint layer is formed of glass or resin.

9. The chip resistor according to claim 8, wherein the first to fourth electrodes are made of an easily solderable metal.

10. The chip resistor according to claim 1, wherein the first substrate and/or the second substrate is formed of ceramics.

11. The chip resistor according to claim 10, wherein the joint layer is formed of glass or resin.

12. The chip resistor according to claim 11, wherein the first to fourth electrodes are made of an easily solderable metal.

13. The chip resistor according to claim 1, wherein the joint layer is formed of glass or resin.

14. The chip resistor according to claim 13, wherein the first to fourth electrodes are made of an easily solderable metal.

15. The chip resistor according to claim 1, wherein the first to fourth electrodes are made of an easily solderable metal.

16. A polygonal flat-panel shape, made of an electrical insulating material and having a first upper surface and a first lower surface, a second substrate having a polygonal flat-panel shape, made of an electrical insulating material and having a second upper surface and a second lower surface, and a joint layer interposed between the first lower surface of the first substrate and the second upper surface of the second substrate and made of an electric insulating material, the chip resistor comprising:

first and second electrodes formed on two first opposing sides of the polygonal flat-panel shape of the first substrate;

a first electric circuit formed on the first upper surface and/or the first lower surface between the first electrode and the second electrode, and having a predetermined conductivity property or a predetermined electric resistance;

third and fourth electrodes formed on two second opposing sides of the polygonal flat-panel shape of the second substrate; and a second electric circuit formed on the second upper surface and/or the second lower surface between the third electrode and the fourth electrode, and having a predetermined conductivity property or a predetermined electric resistance;

wherein a first direction that connects the two first opposing sides and a second direction that connects the two second opposing sides cross each other while the first substrate and the second substrate stack one on another via the joint layer as viewed from the first upper surface, and the first electric circuit and the second electric layer are electrically separated from each other via the joint layer.

* * * * *